(12) United States Patent
Chang

(10) Patent No.: US 7,405,124 B2
(45) Date of Patent: Jul. 29, 2008

(54) FABRICATING METHOD OF NON-VOLATILE MEMORY

(75) Inventor: Ko-Hsing Chang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 132 days.

(21) Appl. No.: 11/306,384

(22) Filed: Dec. 27, 2005

(65) Prior Publication Data
US 2007/0072370 A1    Mar. 29, 2007

(30) Foreign Application Priority Data
Sep. 27, 2005   (TW) .............................. 94133512 A

(51) Int. Cl.
*H01L 21/336* (2006.01)
(52) U.S. Cl. ................ 438/259; 257/316; 257/E29.129
(58) Field of Classification Search ................ 438/257, 438/259; 257/316, E21.179, E21.68, E29.129
See application file for complete search history.

(56) References Cited

U.S. PATENT DOCUMENTS 6,133,601 A * 10/2000 Watanabe .................... 257/314
2003/0193064 A1 * 10/2003 Wu .............................. 257/315
2006/0081906 A1 * 4/2006 Jeong ......................... 257/314

* cited by examiner

*Primary Examiner*—Trung Dang
(74) *Attorney, Agent, or Firm*—Jianq Chyun IP Office

(57) ABSTRACT

A method for fabricating a non-volatile memory is described. A substrate having isolation structures is provided. These isolation structures protrude from the substrate, and a first mask layer is formed on the substrate between the isolation structures. A second mask layer is formed on the substrate. The second and the first mask layers are patterned to form openings exposing part of the surface of the substrate and the isolation structures. A tunneling dielectric layer and a first conductive layer are formed on the substrate. The first conductive layer is filled in the opening, and is divided into blocks by the isolation structures, the second mask layer, and the first mask layer. An inter-gate dielectric layer is formed on the substrate. A second conductive layer is formed on the substrate to fill up the openings. Doped regions are formed in the substrate on both sides of the second conductive layer.

21 Claims, 13 Drawing Sheets

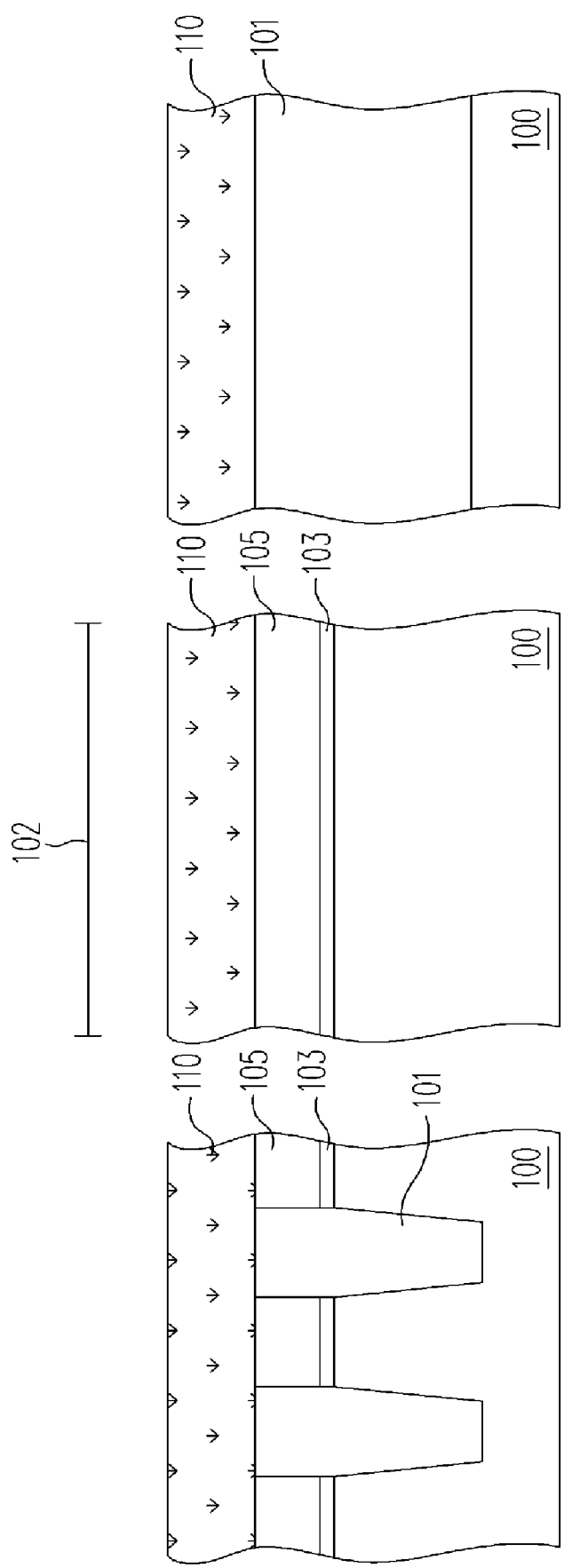

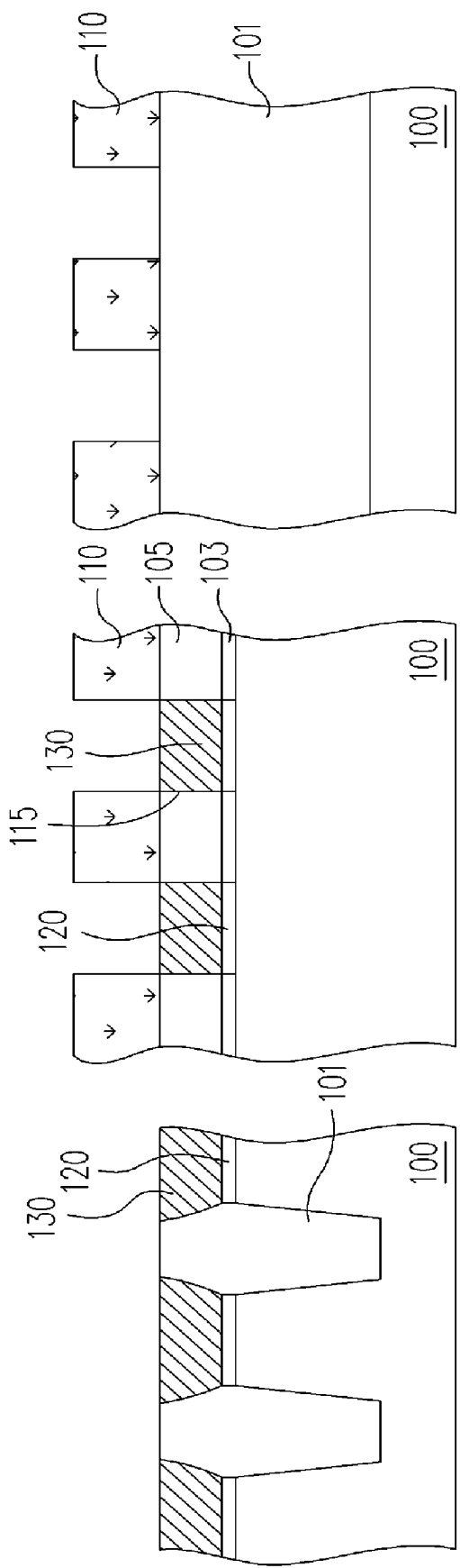

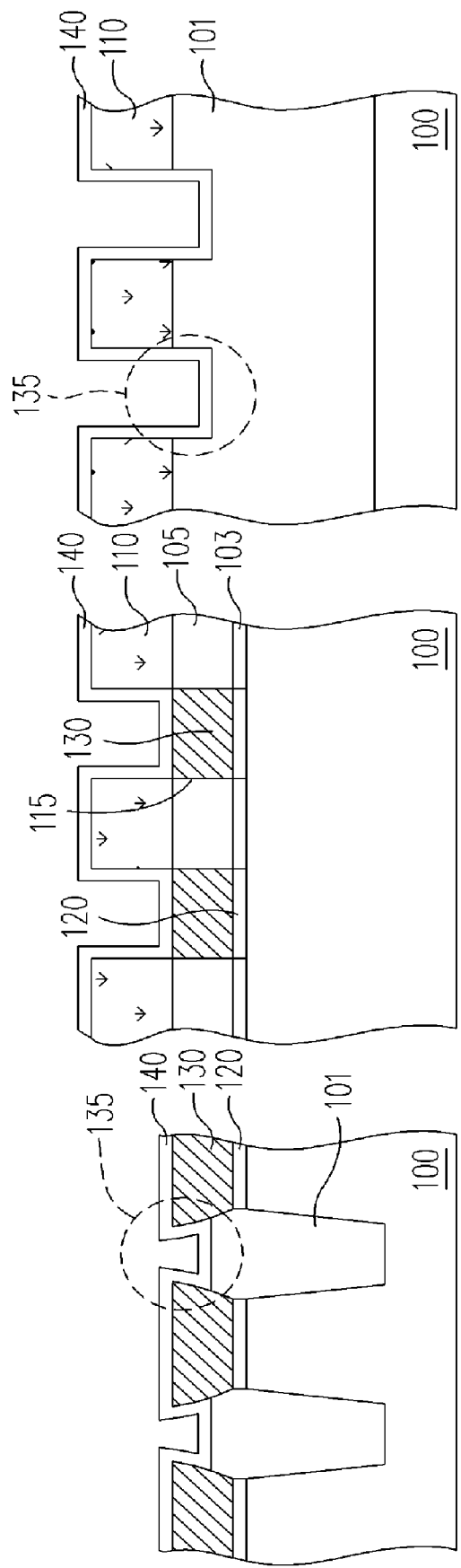

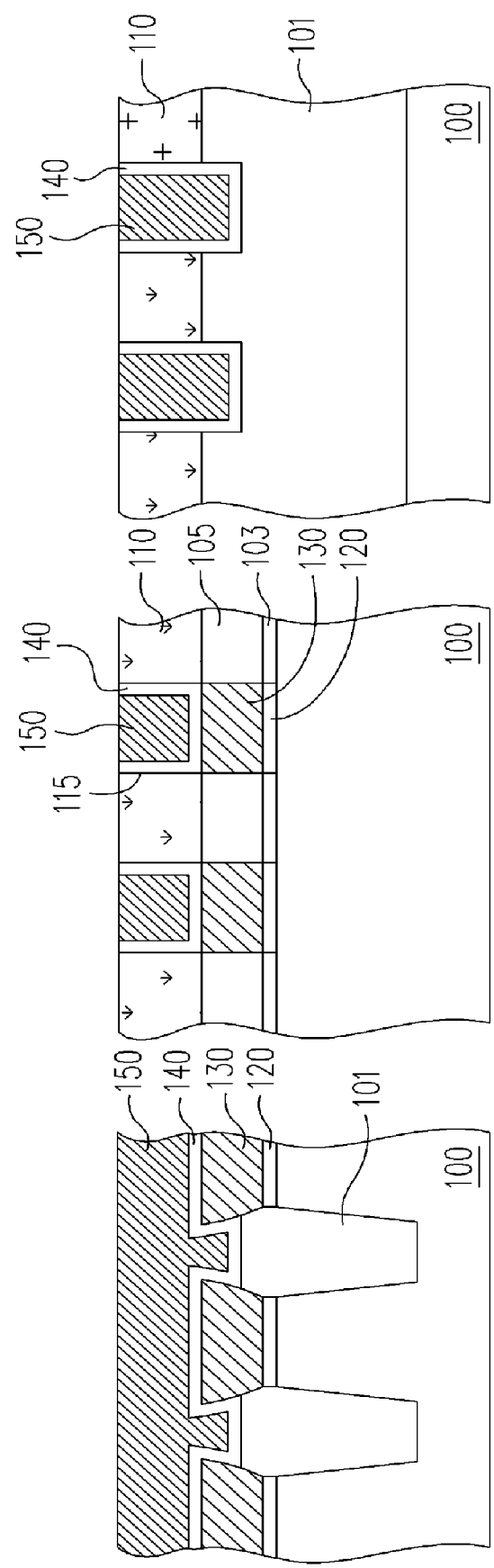

FABRICATING METHOD OF NON-VOLATILE MEMORY

CROSS-REFERENCE TO RELATED APPLICATION

This application claims the priority benefit of Taiwan application serial no. 94133512, filed on Sep. 27, 2005. All disclosure of the Taiwan application is incorporated herein by reference.

BACKGROUND OF THE INVENTION

1. Field of Invention

The present invention relates to a semi-conductive device. More particularly, the present invention relates to a non-volatile memory and a fabricating method thereof.

1. Description of Related Art

Among the non-volatile memories, the flash memory has become one of the most researched products in the industry due to the time-saving operation mode and the cost-saving advantage. Wherein the commonly used flash arrays include the NOR type array structure and NAND type array structure. The structure of flash memory with the NAND type array is to have the memory cells connected in series. The integration and the spatial utilization of flash memory with NAND type array are better than the flash memory with NOR type array. Therefore, the flash memory structure of the NAND type array has been widely used in various electronic products.

In the current market, the NAND type array flash memory mainly has a floating gate and a control gate, and the fabricating process usually requires more than two masks to define these two gates. In other words, more than two lithographing and etching processes are required to complete the fabrication. However, in the semiconductor device fabricating process, the lithographic etching process is the most complicated and most expensive part. Therefore, more lithographic etching process (more masks) usually leads to increased cost and the time consumption during the fabricating process.

In addition, since the floating gate and control gate are formed by etching the conductive layer directly, microbridges are likely formed between adjacent conductive layers, which consequently causes short-circuit. This problem may become more serious as the line width reduces.

SUMMARY OF THE INVENTION

Accordingly, an object of the present invention is to provide a fabricating method of a non-volatile memory, in order to reduce the number of masks, reduce the manufacturing cost, and increase the integration of the devices.

Another object of the present invention is to provide a non-volatile memory capable of avoiding the short circuit and increase the reliability of the memory.

The present invention provides a fabricating method of a non-volatile memory. First, a substrate is provided, wherein a plurality of isolation structures extending in a first direction had been already formed thereon. These isolation structures protrude from the surface of the substrate, and a first mask layer had been formed on the substrate between the isolation structures. Next, a second mask layer is formed on the substrate. Then the second mask layer and the first mask layer are patterned to form a plurality of openings extending in a second direction. The openings expose a portion of the substrate surface and a portion of the isolation structures surface. The first direction and the second direction are interlaced. Next, a tunneling dielectric layer is formed on the substrate. A first conductive layer is formed on the substrate to fill in these openings, so that the first conductive layer is divided into blocks by the isolation structures, the second mask layer and the first mask layer. Next, an inter-gate dielectric layer is formed on the substrate. Then a second conductive layer filling up the openings is formed on the substrate. Then a plurality of doped regions is formed in the substrate on both sides of the second conductive layer.

According to the fabricating method of the non-volatile memory in the embodiment of the present invention, a pad layer is further formed between the first mask layer and the substrate. And after patterning the second mask layer and the first mask layer and before forming the tunneling dielectric layer, the method further includes removing a portion of the pad layer.

According to the fabricating method of the non-volatile memory in the embodiment of the present invention, the material of the above pad layer and the isolation structures can be the same. Therefore, when removing the pad layer, the method further includes removing a portion of the isolation structures.

According to the fabricating method of the non-volatile memory in the embodiment of the present invention, the material of the above inter-gate dielectric layer for example is silicon oxide/silicon nitride/silicon oxide (ONO).

According to the fabricating method of the non-volatile memory in the embodiment of the present invention, after forming the second conductive layer on the substrate and before forming the doped regions in the substrate on both sides of the second conductive layer, the method further includes removing the first mask layer and the second mask layer.

According to the fabricating method of the non-volatile memory in the embodiment of the present invention, the step of forming a first conductive layer on the substrate, the first conductive layer filling the openings and the first conductive layer being divided into blocks by the isolation structures, the second mask layer and the first mask layer include: forming a first conductive layer on the substrate first; removing a portion of the first conductive layer by using the isolation structures as the etch-stopping layer; and removing the top of the isolation structure after a portion of the first conductive layer described above is removed.

According to the fabricating method of the non-volatile memory in the embodiment of the present invention, the method of removing a portion of the first conductive layer includes an etching back process.

According to the fabricating method of the non-volatile memory in the embodiment of the present invention, the method of forming the second conductive layer on the substrate and filling up the openings includes: forming a second conductive layer on the substrate, then removing a portion of the second conductive layer by using the second mask layer as the etch-stopping layer.

According to the fabricating method of the non-volatile memory in the embodiment of the present invention, the material of the above second conductive layer for example is doped polysilicon. The material of the above second mask layer for example is silicon nitride. The above isolation structures for example are trench isolation structures.

In the fabricating method of the non-volatile memory provided in the present invention, the gate pattern to be formed is defined first by the mask layer, and then the conductive layer serving as the floating gate and the control gate is filled in sequence. Since the mask layer can be used as a self-align mask without the lithographic etching procedures, the cost can be significantly reduced. In addition, the conventional micro-bridge problem while defining the floating gate and the control gate can be avoided, therefore the short circuit can be prevented.

The present invention provides a non-volatile memory having the substrate, a plurality of stacked gate structures and a plurality of doped regions. The stacked gate structures are disposed on the substrate, and the stacked gate structures, from the substrate bottom, have the tunneling dielectric layer, the floating gate, the inter-gate dielectric layer and the control gate, wherein the inter-gate dielectric layer extends from both of the side walls of the control gate. The doped regions are disposed between the stacked gate structures.

According to the non-volatile memory in the embodiment of the present invention, the material of the above inter-gate dielectric layer for example is silicon oxide/silicon nitride/silicon oxide (ONO). The material of the above floating gate for example is doped polysilicon. The material of the above control gate for example is doped polysilicon. The above doped regions are N doped regions.

According to the non-volatile memory described in the embodiment of the present invention, the above control gate is a word line.

In the non-volatile memory provided in the present invention, an inter-gate dielectric layer is also disposed around the control gate. In conjunction with the memory fabricating method described above, the micro-bridge problem between the control gates can be further avoided, therefore the short circuit is avoided.

The present invention further provides another fabricating method of the non-volatile memory. For example, a substrate is provided first, wherein a plurality of isolation structures extending in a first direction had been formed in the substrate already. These isolation structures protrude from the substrate surface, and a pad layer and a first mask layer had been formed on the substrate between the isolation structures. Next, a second mask layer covering the isolation structures and the first mask layer are formed on the substrate. Then the second mask layer and the first mask layer are patterned to form a plurality of openings extending in a second direction. The openings expose a portion of the surface of the pad layer and a portion of the surface of the isolation structures. The first direction and the second direction are interlaced. Next, the pad layer is removed, and a tunneling dielectric layer and a first conductive layer are formed on the substrate. Then, a portion of the first conductive layer is removed by using the isolation structures as the etch-stopping layer, so that the first conductive layer is divided into blocks by the isolation structures, the second mask layer and the first mask layer. Next, a portion of the top of the isolation structures is removed, and an inter-gate dielectric layer is formed on the substrate. The inter-gate dielectric layer covers the first conductive layer and the second mask layer. Then a second conductive layer filling up the openings between the mask layers is formed on the inter-gate dielectric layer. Then, a portion of the second conductive layer is removed by using the second mask layer as the etch-stopping layer. Next the first mask layer and the second mask layer are removed. Then a plurality of the doped regions is formed in the substrate on both sides of the second conductive layer.

According to the fabricating method of the non-volatile memory in an embodiment of the present invention, the material of the above pad layer for example is the same with the material of the isolation structures.

According to the fabricating method of the non-volatile memory in an embodiment of the present invention, while removing the pad layer, the method further includes removing a portion of the isolation structures.

According to the fabricating method of the non-volatile memory in an embodiment of the present invention, the material of the above inter-gate dielectric layer for example is silicon oxide/silicon nitride/silicon oxide (ONO).

According to the fabricating method of the non-volatile memory in an embodiment of the present invention, the above method of removing a portion of the first conductive layer by using the isolation structures as the etch-stopping layer for example is an etching back process.

According to the fabricating method of the non-volatile memory in an embodiment of the present invention, the method of removing a portion of the second conductive layer by using the second mask layer as the etch-stopping layer for example is an etching back process or a Chemical Mechanical Polishing (CMP) process.

According to the fabricating method of the non-volatile memory in an embodiment of the present invention, the method of forming the above tunneling dielectric layer for example is a Thermal Oxidation process.

Through the formation of the mask layer, the present invention defines the pattern of the floating gate and the pattern of the control gate first, then uses the mask layer as the self-align mask, so the lithographic etching procedure and others are not needed. Therefore the number of masks in the process is reduced, and the manufacturing costs are saved. In addition, since the direct lithographing, etching procedures to the conductive layer are not needed, the micro-bridge problem between the conductive layers due to the reduced line width can be avoided, thus the short circuit can be further prevented.

In order to the make the aforementioned and other objects, features and advantages of the present invention comprehensible, a preferred embodiment accompanied with figures is described in detail below.

BRIEF DESCRIPTION OF THE DRAWINGS

FIG. 2A to FIG. 2F are cross-sectional views along line a-a' of FIG. 1A to FIG. 1F FIG. 3A to FIG. 3F are cross-sectional views along line b-b' of FIG. 1A to FIG. 1F.

FIG. 4A to FIG. 4F are cross-sectional views along line c-c' of FIG. 1A to FIG. 1F.

DESCRIPTION OF EMBODIMENTS

Figure 1A:
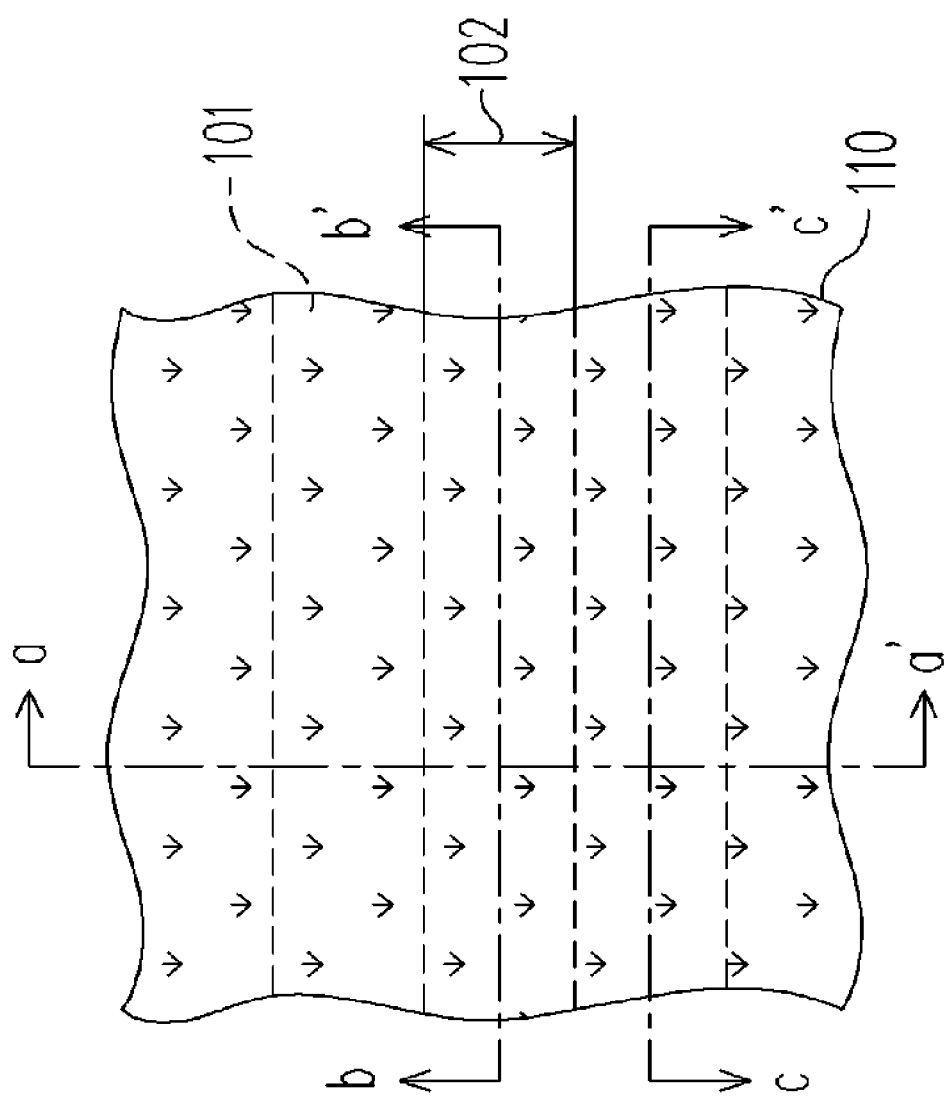
FIG. 1A to FIG. 1F are top views of the fabricating process of a non-volatile memory of one embodiment of the present invention.
Figure 1B:
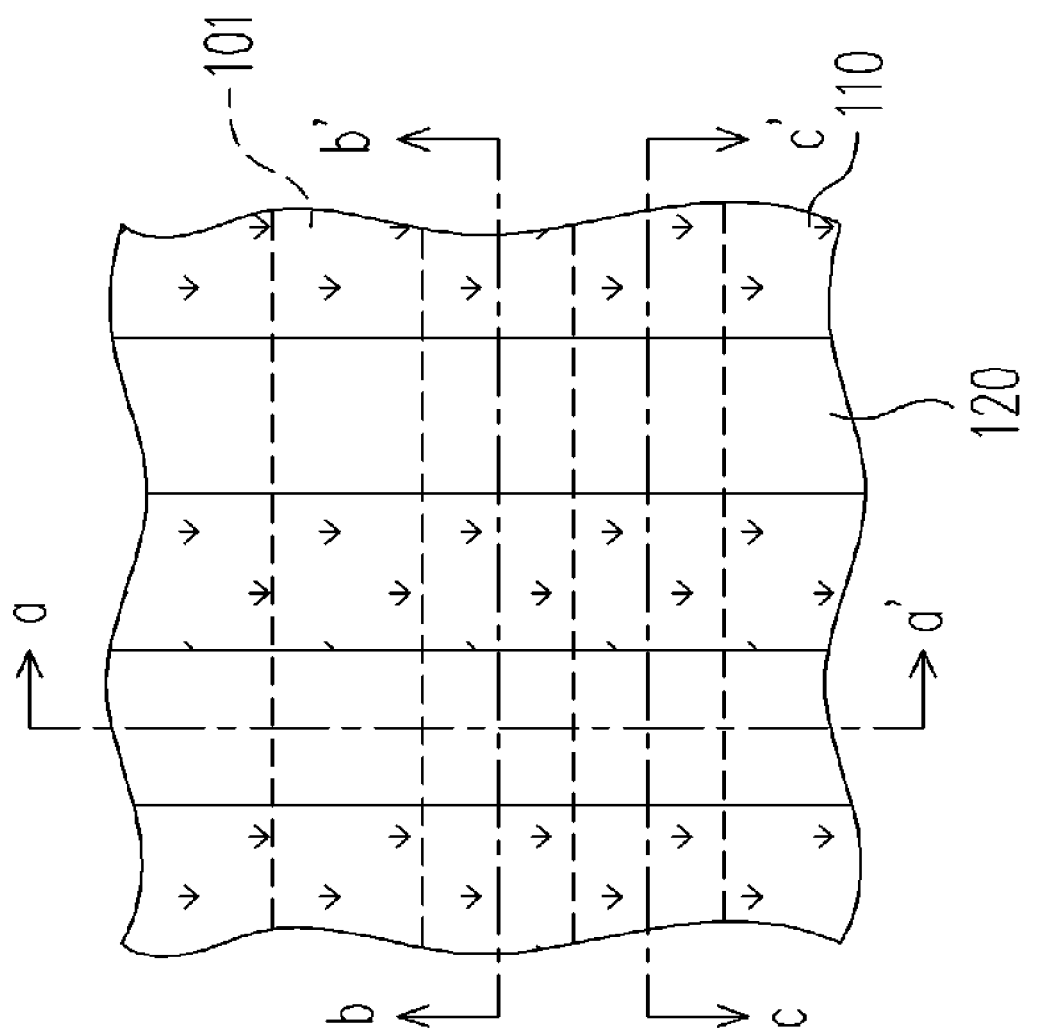
Figure 1C:
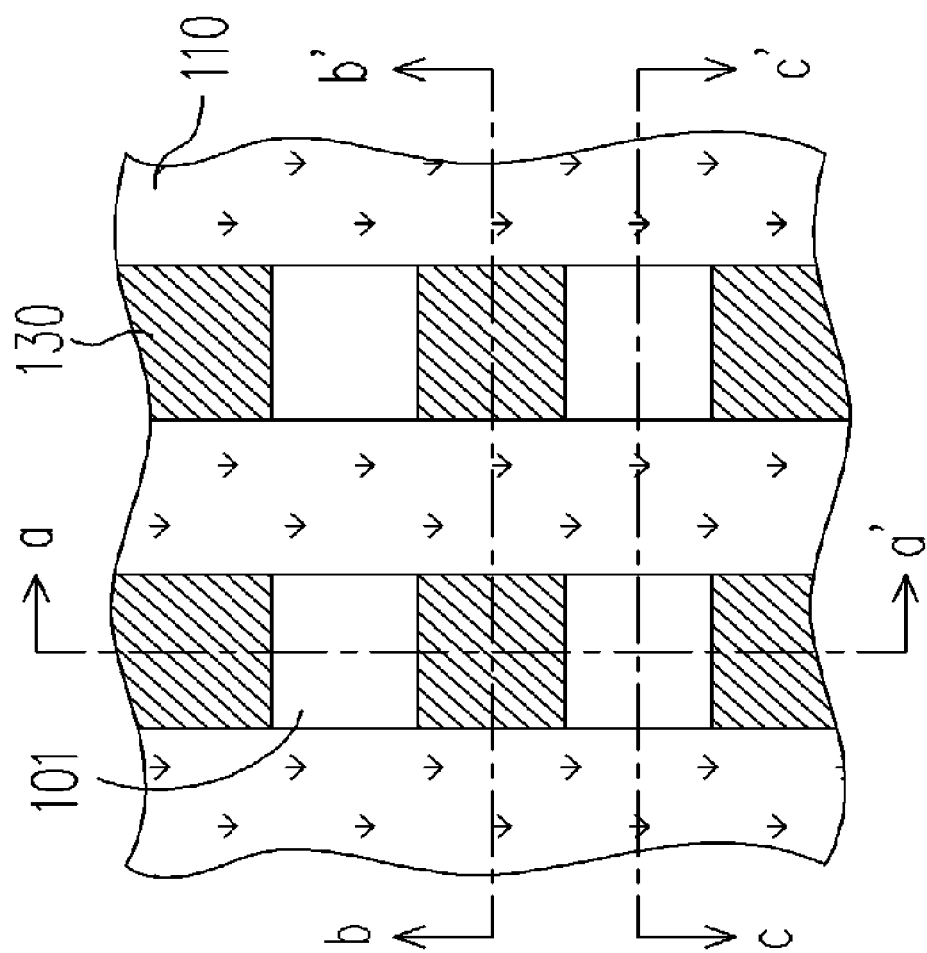
Figure 1D:
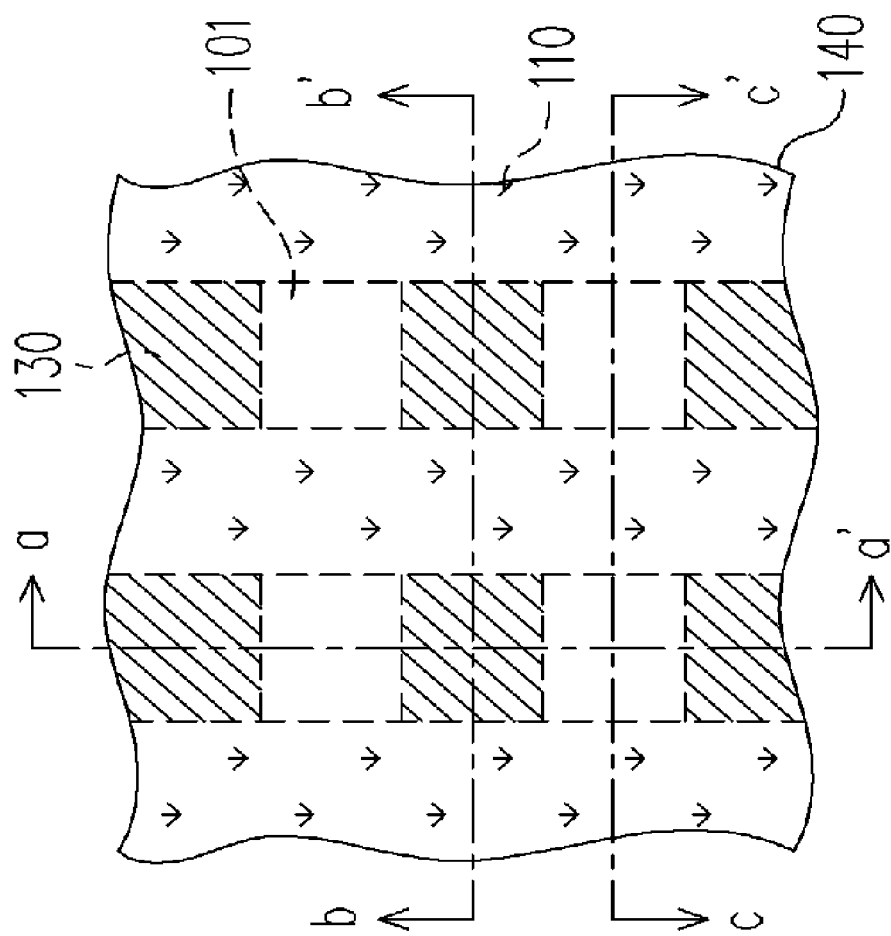
Figure 1E:
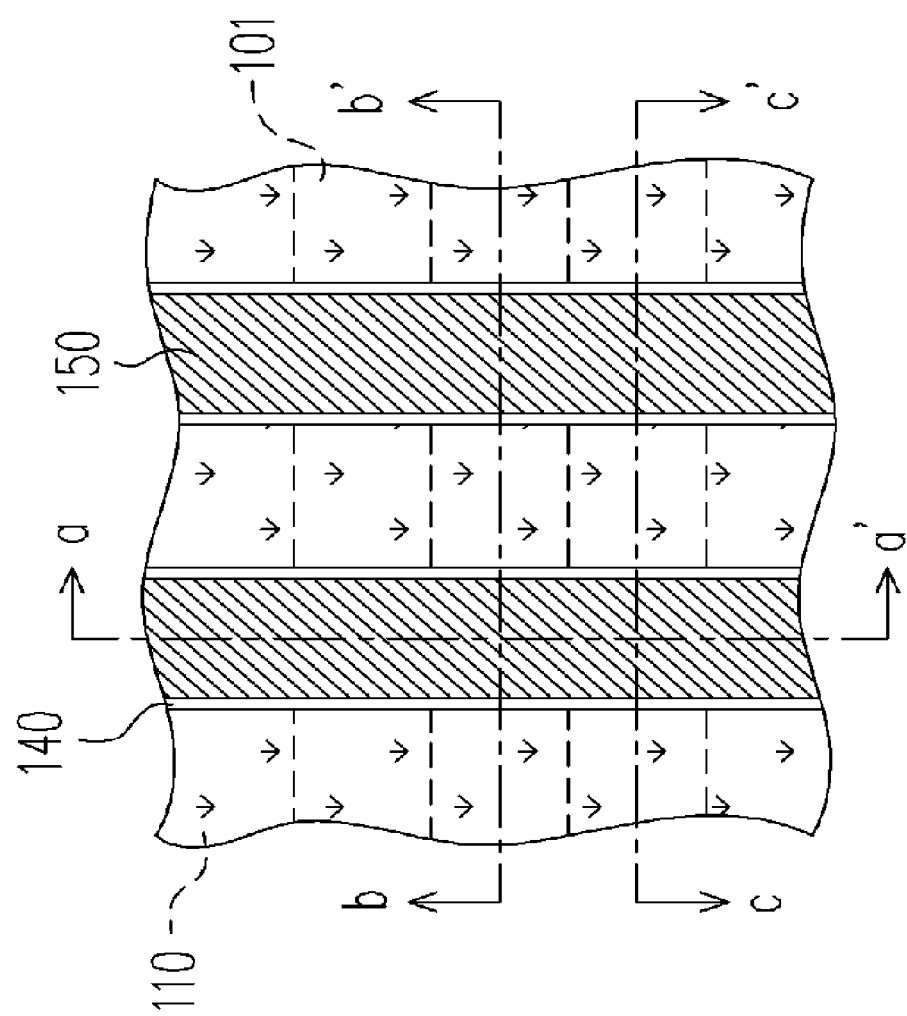
Figure 1F:
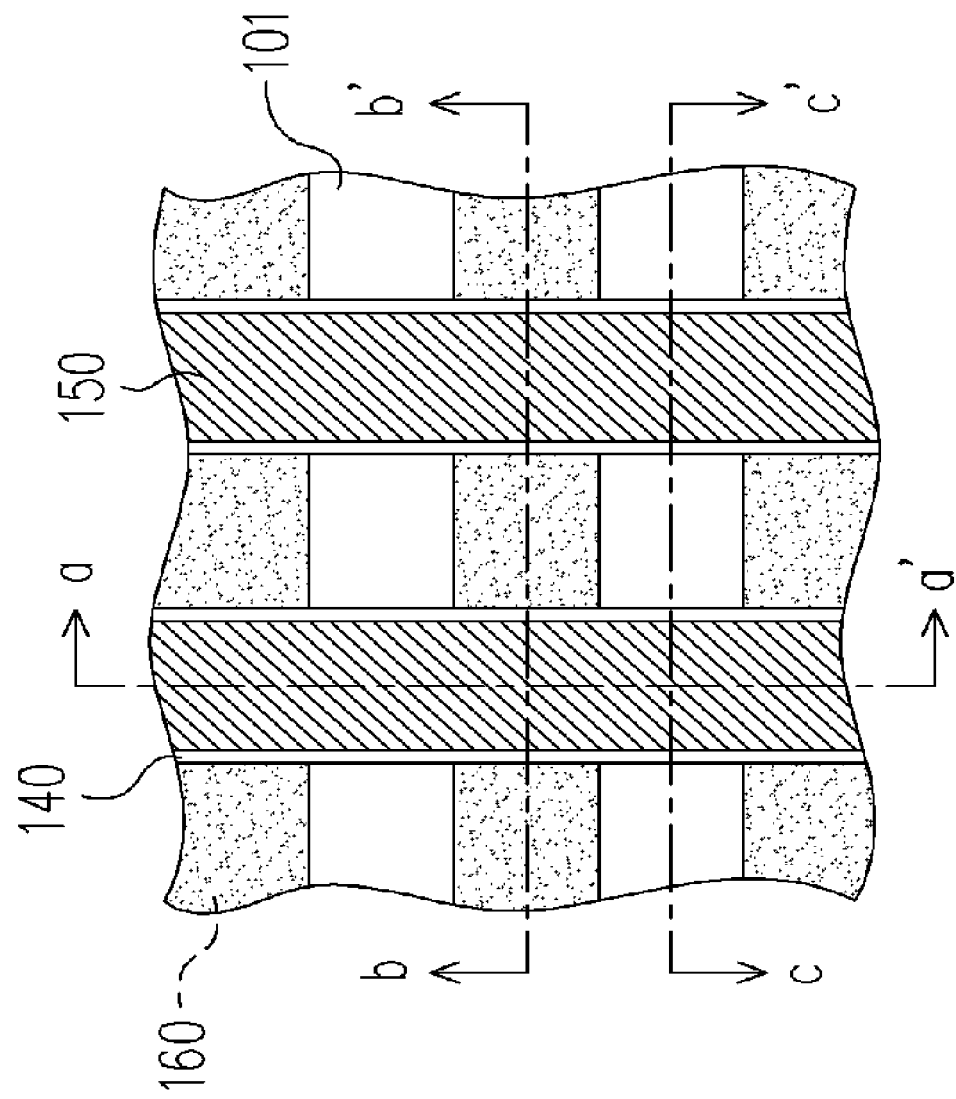
Figures 2B, 3B, 4B:
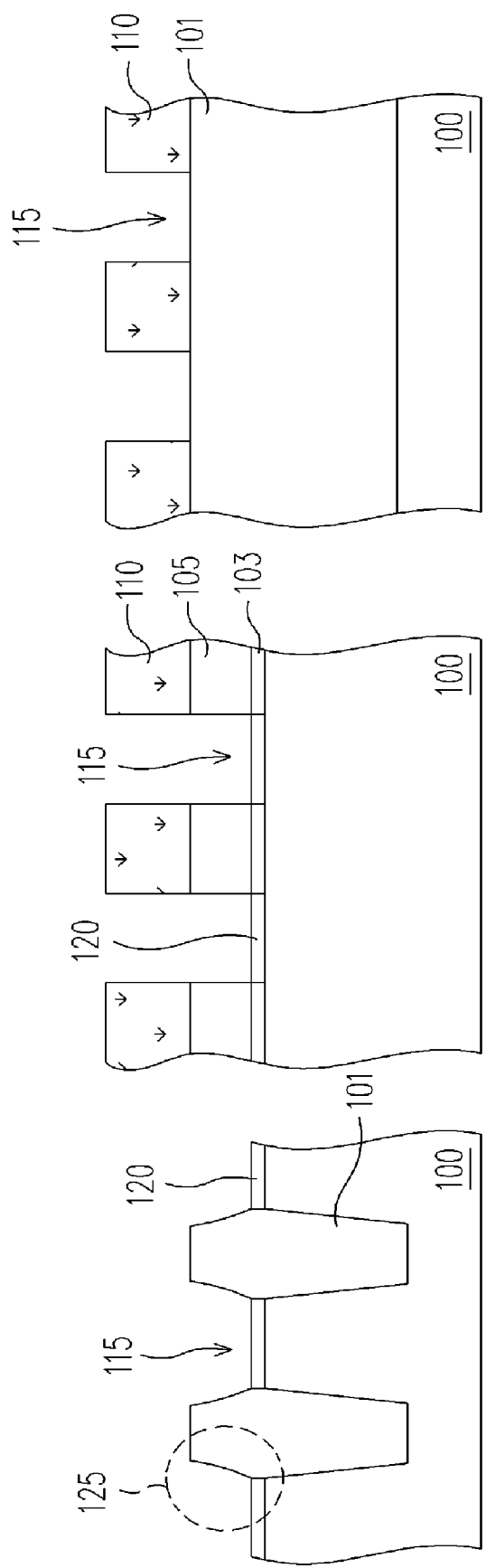
Figures 2F, 3F, 4F:
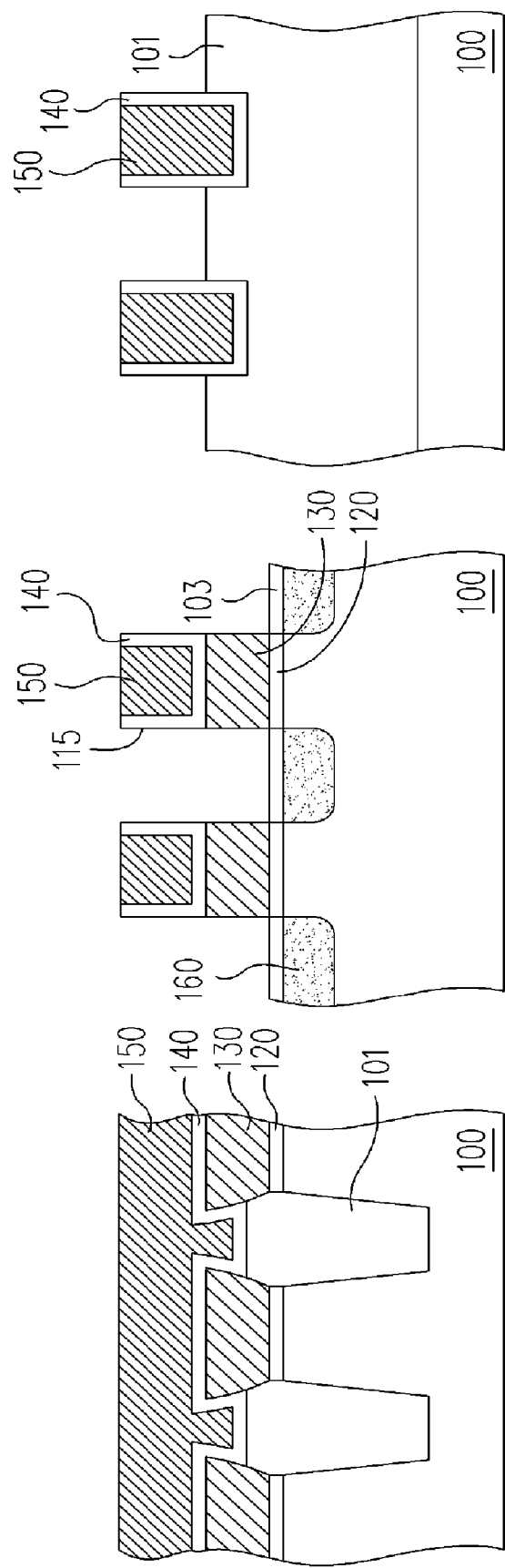

FIG. 1A to FIG. 1F are schematic top views of the fabricating process of a non-volatile memory of one embodiment of the present invention. FIG. 2A to FIG. 2F are cross-sectional views along line a-a' of FIG. 1A to FIG. 1F. FIG. 3A to FIG. 3F are cross-sectional views along line b-b' of FIG. 1A to FIG. 1F. FIG. 4A to FIG. 4F are cross-sectional views along line c-c' of FIG. 1A to FIG. 1F. Wherein the line a-a' is a cutting line along the word lines, the line b-b' is a cutting line along the active area, and the line c-c' is a cutting line along the isolation structures.

The fabricating method of the non-volatile memory in the present invention is adapted for forming a non-volatile memory of NAND type array. Of course, the present fabricating method can also be used to form other non-volatile memories. With reference to FIG. 1A, FIG. 2A, FIG. 3A and FIG. 4A, first, the substrate 100 is provided. A plurality of isolation structures 101 had been formed in the substrate 100.

These isolation structures 101 protrude from the surface of the substrate 100 and define the active area 102. These isolation structures 101 for example are shallow trench isolation structures. The method of forming the isolation structures 101 for example is by forming a full pad layer 103 and a full mask layer 105 first on the substrate 100, then a plurality of trenches (not shown) is etched, then the dielectric material is filled. The material layer of the pad layer 103 for example is silicon oxide. The method of forming the pad layer 103 for example is a thermal oxidation process. The material of the mask layer 105 for example is silicon nitride, and the method of forming the mask layer 105 for example is a Chemical Vapor Deposition process. The material of the dielectric layer filled in the trenches for example is silicon oxide.

Next, another mask layer 110 is formed on the substrate 100. The material of the mask layer 110 can be the same material as the mask layer 105, such as silicon nitride, and the fabricating method thereof for example is a Chemical Vapor Deposition process. In addition, the material of the mask layer 105 and the mask layer 110 has a different etching selectivity from the material of the isolation structures 101.

Next, with reference to FIG. 1B, FIG. 2B, FIG. 3B and FIG. 4B, the mask layer 110 and the mask layer 105 are patterned to form a plurality of openings 115 exposing a portion of the surface of the substrate 100 and a portion of the surface of the isolation structures 101. The method of patterning the mask layer 110 and the mask layer 105 for example is a lithographic etching process. Since the material of the mask layer 110 and the mask layer 105 has a different etching selectivity from the material of the isolation structures 101, the isolation structures 101 will not be etched, and therefore can remain.

Next, a portion of the pad layer 103 is removed. The method of removing the pad layer 103 for example is a wet etching process. In the present embodiment, since the material of the isolation structures 101 is the same as the material of the pad layer 103, a portion of the isolation structures 101 is also removed to form the recess 125 as shown in FIG. 2C when a portion of the pad layer 103 is removed. Next, a tunneling dielectric layer 120 is formed on the substrate 100. The material of the tunneling dielectric layer 120 for example is silicon oxide. The method of forming the tunneling dielectric layer 120 for example is a thermal oxidation process.

Next, with reference to FIG. 1C, FIG. 2C, FIG. 3C and FIG. 4C, a conductive layer 130 filling these openings 115 is formed on the substrate 100. The material of the conductive layer 130 for example is doped polysilicon, and the fabricating method thereof for example is by performing an Ion Implant procedure after forming a non-doped polysilicon (not shown) by using the chemical vapor deposition method, or by forming the doped polysilicon layer in a chemical vapor deposition process by using an in-situ method. Then, the conductive layer 130 on the isolation structures 101 is removed, so that the surface of the conductive layer 130 is the same as the top surface of the isolation structures 101. The method of removing the conductive layer 130 for example is an etching back process by using the isolation structures 101 as the mask. At this time, the isolation structures 101, the mask layer 110 and the mask layer 105 divide the conductive layer 130 into blocks, and the conductive layer 130 is used as the floating gate.

Next, with reference to FIG. 1D, FIG. 2D, FIG. 3D and FIG. 4D, the top of the isolation structures 101 is removed to form the recess 135 as shown in FIG. 2D and FIG. 4D. The method of removing the top of the isolation structures 101 for example is an etching method. Then, the inter-gate dielectric layer 140 is formed on the substrate. The material of the inter-gate dielectric layer 140 for example is silicon oxide/ silicon nitride/silicon oxide (ONO), and the fabricating method thereof is by forming a silicon oxide layer, a silicon nitride layer and a silicon oxide layer in sequence by using the chemical vapor deposition method first. Of course, the material of the inter-gate dielectric layer 140 can also be silicon oxide, silicon nitride or silicon oxide/silicon nitride and the similar materials, and the fabricating method thereof for example is by performing the chemical vapor deposition process using different reaction gas depending on the material thereof.

Next, with reference to FIG. 1E, FIG. 2E, FIG. 3E and FIG. 4E, another conductive layer 150 fully filling up the openings 115 is formed on the substrate 100. The conductive layer 150 is used as the control gate. The material of the conductive layer 150 for example is the suitable conductive material such as metal, metal silicide or doped polysilicon. The fabricating method of the conductive layer 150 for example is by performing the mechanical vapor deposition or the chemical vapor deposition process depending on the material thereof to form a conductive material layer (not shown) first on the substrate 100, then removing the conductive layer 150 on the mask layer 110 by using the chemical mechanical polishing or etching back method. Since the inter-gate dielectric layer 140 is not thick, the inter-gate dielectric layer 140 on the mask layer 110 may be also removed together.

Next, with reference to FIG. 1F, FIG. 2F, FIG. 3F and FIG. 4F, the mask layer 110 and the mask layer 105 are removed to form a plurality of doped regions 160 in the substrate 100 on both sides of the conductive layer 150. The method of removing the mask layer 110 and the mask layer 105 for example is a dry-etching process. The fabricating method of the doped regions 160 for example is by using the conductive layer as the mask to perform the dope implant process. The dope implanted for example is N dope. Of course, after removing the mask layer 110 and the mask layer 105 and before forming the doped regions 160, the pad layer 103 can be removed first, depending on the fabricating requirement. The subsequent process of forming the non-volatile memory is familiar to those skilled in the art and is not described here.

The fabricating method of the non-volatile memory in the present invention is first by defining the gate pattern to be formed by using the mask layer 110 and the mask layer 105, then forming the floating gate (conductive layer 130) and the control gate (conductive layer 150) in sequence. Since the pattern of the gate has been defined, the formation of the floating gate and the control gate just requires the self-align mask of the mask layer 110 and the mask layer 105, without performing the lithographic etching procedure. Therefore, the costs can be significantly reduced.

Besides, the above fabricating method can further avoid the micro-bridges which cause contacts between adjacent conductive layers and results in short circuit when defining the floating gate and the control gate in the conventional method.

In addition, the formation of the recess 135 and the recess 125 both can increase the area between the floating gate (conductive layer 130) and the control gate (conductive layer 150). Therefore the capacitive coupling ratio can be increased. The higher the capacitive coupling ratio is, the lower operation voltage of the memory needs, thus increasing the efficiency of the device.

Figure 5:
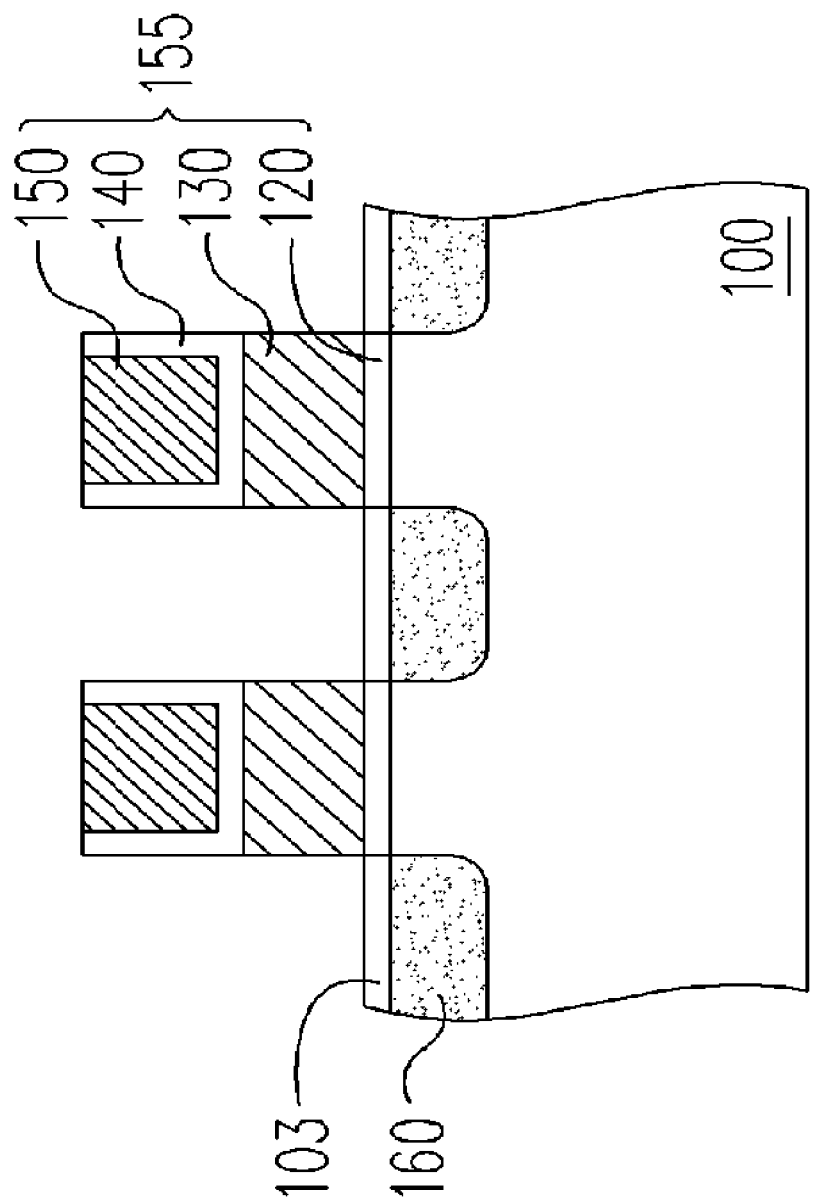
FIG. 5 is a schematic cross-sectional view of a non-volatile memory of an embodiment of the present invention.

The non-volatile memory formed by using the above fabricating method of the non-volatile memory will be described below. FIG. 5 is a schematic cross-sectional view of a non-volatile memory of an embodiment of the present invention. In the present invention, the non-volatile memory for example is an NAND type flash memory.

With reference to Fig.5, the non-volatile memory includes a substrate 100, a plurality of stacked gate structures 155 and a plurality of doped regions 160. The stacked gate structures 155 for example are disposed on the substrate 100. And the stacked gate structures 155 includes, from the substrate bottom, the tunneling dielectric layer 120, the floating gate 130, the inter-gate dielectric layer 140 and the control gate 150, wherein the inter-gate dielectric layer 140 for example covers merely the upper surface of the floating gate 130 and extends from the two side walls of the control gate 150. The width of the control gate 150 is smaller than that of the floating gate 130. The doped regions 160 for example are disposed between the stacked gate structures 155.

Wherein, the material of the tunneling dielectric layer 120 for example is silicon oxide or other proper dielectric materials. The materials of the inter-gate dielectric layer 140 for example are silicon oxide, silicon nitride or ONO or other composite dielectric layer. The materials of the floating gate 130 and the control gate for example are conductive materials such as metal, metal silicide or doped polysilicon, etc. The doped regions 160 for example are doped P or doped N, depending on the type of the device. In the present embodiment, the control gate 130 serves as the word line of the memory.

The non-volatile memory of the present invention has the inter-gate dielectric layer 140 disposed around the control gate 150. In conjunction with the above fabricating method of the memory, micro-bridge between the control gates 150 can be further avoided, and the short circuit can be prevented. Therefore, the memory reliability can be improved.

To sum up, the present invention defines the patterns of floating gate and the control gate first through forming the mask layer. Then the mask layer can be used as the self-align mask while the floating gate and the control gate are fabricated, so the lithographic etching process and etc. is not required. Therefore the number of the masks can be reduced, and the manufacturing cost can be reduced accordingly. Moreover, since the lithographing, etching procedures are not required on the conductive layer, the micro-bridges between the conductive layers due to reduced line width can be avoided. Thus the short circuit can be prevented. That is, the memory with narrower line width can be fabricated by using the memory fabricating method used in the present invention, and the goal of increasing device integration can be achieved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A fabricating method of a non-volatile memory, comprising:
    providing a substrate having a plurality of isolation structures extending in a first direction already formed thereon, the isolation structures protruding from the surface of the substrate, and a first mask layer formed on the substrate between the isolation structures;
    forming a second mask layer on the substrate;
    patterning the second mask layer and the first mask layer to form a plurality of openings extending in a second direction, the openings exposing a portion of the surface of the substrate and a portion of the surface of the isolation structures, wherein the first direction and the second direction are interlaced;
    forming a tunneling dielectric layer on the substrate;
    forming a first conductive layer on the substrate, the first conductive layer filling the openings and the first conductive layer being divided into blocks by the isolation structures, the second mask layer and the first mask layer;
    forming an inter-gate dielectric layer on the substrate;
    forming a second conductive layer on the substrate, the second conductive layer filling up the openings; and
    forming a plurality of doped regions in the substrate on both sides of the second conductive layer.

2. The method of claim 1, further comprising: forming a pad layer between the first mask layer and the substrate.

3. The method of claim 2, further comprising: removing a portion of the pad layer after the step of patterning the second mask layer and the first mask layer and before the step of forming the tunneling dielectric layer.

4. The method of claim 3, wherein the material of the pad layer and the material of the isolation structures are the same.

5. The method of claim 4, further comprising: removing a portion of the isolation structures while the pad layer is removed.

6. The method of claim 1, wherein the material of the inter-gate dielectric layer comprises silicon oxide/silicon nitride/silicon oxide (ONO).

7. The method of claim 1, further comprising: removing the first mask layer and the second mask layer after the step of forming the second conductive layer on the substrate and before the step of forming the doped regions in the substrate on both sides of the second conductive layer.

8. The method of claim 1, wherein the step of forming the first conductive layer, filling the openings, and dividing the first conductive layer into blocks by these isolation structures, the second mask layer and the first mask layer comprises:
    forming the first conductive layer on the substrate; and
    removing a portion of first conductive layer by using the isolation structures as the etch-stopping layer.

9. The method of claim 8, further comprising: removing the top of the isolation structures after the first conductive layer is removed.

10. The method of claim 8, wherein the step of removing a portion of the first conductive layer comprises using an etching back process.

11. The method of claim 1, wherein the step of forming the second conductive layer and filling up the openings comprises:
    forming the second conductive layer on the substrate; and
    removing a portion of the second conductive layer by using the second mask layer as the etch-stopping layer.

12. The method of claim 1, wherein the material of the second conductive layer comprises doped polysilicon.

13. The method of claim 1, wherein the material of the second mask layer comprises silicon nitride.

14. The method of claim 1, wherein the isolation structures are trench isolation structures.

15. A fabricating method of a non-volatile memory, comprising:
    providing a substrate having a plurality of isolation structures extending in a first direction already formed in the substrate, the isolation structures protruding from the substrate, and a pad layer and a mask layer being disposed on the substrate between these isolation structures;
    forming a second mask layer on the substrate, covering these isolation structures and the first mask layer;
    patterning the second mask layer and the first mask layer to form a plurality of openings extending in a second direction, the openings exposing a portion of the surface of the pad layer and a portion of the surface of the isolation structures, wherein the first direction and the second direction are interlaced;

removing the exposed pad layer;

forming a tunneling dielectric layer on the substrate;

forming a first conductive layer on the substrate;

removing a portion of the first conductive layer by using the isolation structures as the etch-stopping layer and the first conductive layer being divided into blocks by the isolation structures, the second mask layer and the first mask layer;

removing a portion of the top of the isolation structures;

forming an inter-gate dielectric layer on the substrate, wherein the inter-gate dielectric layer covers the first conductive layer and the second mask layer;

forming a second conductive layer on the inter-gate dielectric layer, the second conductive layer filling up the openings between the second mask layers;

removing a portion of the second conductive layer by using the second mask layer as the stopping layer;

removing the first mask layer and the second mask layer; and forming a plurality of doped regions in the substrate on both sides of the second conductive layer.

16. The method of claim 15, wherein the material of the pad layer and the material of the isolation structures are the same.

17. The method of claim 15, further comprising: removing a portion of the isolation structures while the pad layer is removed.

18. The method of claim 15, wherein the material of the inter-gate dielectric layer comprises silicon oxide/silicon nitride/silicon oxide (ONO).

19. The method of claim 15, wherein the step of removing a portion of the first conductive layer by using the isolation structures as the stopping layer comprises an etching back process.

20. The method of claim 15, wherein the step of removing a portion of the second conductive layer by using the second mask layer as the stopping layer comprises an etching back or chemical mechanical polishing method.

21. The method of claim 15, wherein the step of forming the tunneling dielectric layer comprises a thermal oxidation process.

* * * * *